United States Patent [19]
Watts

[11] Patent Number: 5,871,629
[45] Date of Patent: Feb. 16, 1999

[54] METHOD AND APPARATUS FOR FIXTURING SUBSTRATE ASSEMBLIES FOR ELECTROLYTIC PLATING

[75] Inventor: Kenneth Wayne Watts, Boca Raton, Fla.

[73] Assignee: International Business Machines Corporation, Armonk, N.Y.

[21] Appl. No.: 716,487

[22] Filed: Sep. 18, 1996

[51] Int. Cl.[6] .............................. C25D 17/06; C25D 5/02; C25D 7/00; B25B 1/08
[52] U.S. Cl. ..................... 205/145; 204/242; 204/297 R; 204/297 W; 269/231; 269/903
[58] Field of Search .......................... 204/297 R, 297 W, 204/242; 269/53, 43, 229, 231, 235, 903; 205/118, 145

[56] References Cited

U.S. PATENT DOCUMENTS

| | | | |
|---|---|---|---|
| 2,137,819 | 11/1938 | Wagner | 204/297 W |
| 3,502,317 | 3/1970 | Killerby et al. | 269/43 |
| 4,152,241 | 5/1979 | Warren | 204/297 W |
| 4,312,716 | 1/1982 | Maschler et al. | 204/297 W |
| 4,682,765 | 7/1987 | Mainville | 269/43 X |
| 5,022,976 | 6/1991 | Röll et al. | 204/297 R |
| 5,516,416 | 5/1996 | Canaperi et al. | 204/297 R |
| 5,580,432 | 12/1996 | Shibata et al. | 204/297 R |

*Primary Examiner*—Donald R. Valentine
*Attorney, Agent, or Firm*—Quarles & Brady

[57] ABSTRACT

A fixture for securing a pin grid array (PGA) and grounding all circuits or pins in the PGA for electrolytic plating provides a series of parallel wires that are inserted between every other gap between the PGA pin rows. The cross section of each wire is constructed to provide a first cross sectional width at one location that is less than or equal to the PGA gap width for insertion into the PGA gap and a second cross sectional width, at an angle to the first cross sectional width, that is greater than the gap width. With this arrangement, the wire can be inserted in the gap with the first cross sectional width traversing the gap and then rotated to bring the wider, second cross sectional width into spreading engagement with the pins for a reliable mechanical and conductive contact.

22 Claims, 5 Drawing Sheets

METHOD AND APPARATUS FOR FIXTURING SUBSTRATE ASSEMBLIES FOR ELECTROLYTIC PLATING

FIELD OF THE INVENTION

The invention relates generally to methods and apparatus for electrolytic plating and particularly to fixturing for electrolytic plating.

BACKGROUND OF THE INVENTION

A typical multi-layered substrate assembly, which is also referred to as a Pin Grid Array (PGA), has a multitude of individual circuits within it. In order to plate the exposed pins and solder pads by electrodeposition, it is necessary to electrically short each pin or circuit to the cathode. A number of techniques are currently used to accomplish this purpose.

In one method, known as tie-bar plating, a branch is designed into each circuit and leads to an edge of the substrate. A plating fixture can be constructed to short the circuits through a grounding contact with one or more edges of the substrate. This approach requires an array of parallel conductors leading to the edge of the substrate from each of the circuits in the assembly. For high speed integrated circuit devices, these parallel conductors form antennas that can cause noise within the substrate assembly during operation. This method is therefore not useful for high speed devices.

In certain PGA's, such as multiple chip modules, some circuits are connected to each other in a pad-to-pad connection and do not utilize a pin. Accordingly, some pins are not electrically connected to the substrate edges. These floating pins are not grounded and therefore do not get plated in a substrate-based tie-bar plating process.

In other methods, such as through-pin plating, a fixture makes contact with the ends of the pins. In PGA's in which every circuit terminates at at least one pin, every circuit element is thus shorted to a common point. The grounding element for contacting each of the pins, however, covers the pin side of the substrate assembly and restricts the flow of the plating bath. The result is that the plate thickness is typically thicker around the edges of the substrate than in the center. These contacting elements are also generally expensive and difficult to construct.

In interstitial pin arrays, each row of pins is staggered relative to each other so that each pin of a row is transversely aligned with a space in each of the adjacent rows of pins. Interstitial pin arrays generally provide more circuits, and the plating difficulties noted above are further extenuated.

SUMMARY OF THE INVENTION

The invention provides a fixturing technique and associated apparatus to securely hold a pin grid array during electroplating and other preparatory processes. The fixture also preferably grounds the PGA circuits without unduly interfering with access of the electroplating bath to the PGA pins and substrate. According to the invention, a support frame preferably holds a series of conductive support elements, such as wires, in parallel for insertion in gaps between the rows of pins in a PGA.

According to the invention, the cross section of the support elements are sized to exceed the width of the gap and thereby spread the adjacent pin rows into a resiliently biased, secure engagement with the support elements. The integral engagement assures strong mechanical gripping between the support elements and the pins as well as reliable electrical contact. For coating processes where scraping or other surface damage to the pin surfaces is not critical, such as preliminary zinc coating of the pins, the cross section of the support elements can be constructed, for example, in a circle that can be wedged into position within the PGA gap.

In final coating processes where surface condition is more critical, such as final plating with gold, each support element preferably has a cross section constructed to permit easy insertion of the support element into a PGA gap and rotation into an electrically conductive and mechanically supporting engagement with the adjacent PGA pin rows. To this end, the cross section of each support element preferably has a first width that is less than or equal to the gap width. During insertion and removal, the first width is oriented to traverse the gap.

The cross section also preferably has a second, larger width that is greater than the gap width and is at an angle from the first width. After the support element is positioned in the gap, the support element is rotated to bring the second, larger width portion of the cross section into engagement with the surrounding pins. Because of the larger width, the support element spreads the adjacent pins outwardly from the gap and creates a positive engagement with the pins by virtue of their resilient tendency toward their original, unflexed positions.

The support elements can be rotated between the releasing orientation of the first width and the holding orientation of the second width by a rotator, such as a lever connected to the ends of the support elements for common rotation of the support elements by axial translation of the lever.

The support elements can be electrically joined together to short all the circuit elements to a common point by any suitable means, for example, a grounding strip on the support frame that contacts each support element and connects it commonly to an external cathode or the like.

Because the support elements spread or flex the adjacent pins outwardly, the gaps on the outer sides of the flexed pins are left open. Thus, the support elements are positioned in every other gap of the PGA. This alternating arrangement reduces the number of support elements and reduces the obstruction of the electrodeposition bath. If the PGA has an odd number of rows of pins, two adjacent rows can receive a conductive element to insure that the odd row is contacted.

The method and apparatus are simple and inexpensive to implement. The flexor reaction forces in aggregate provide sufficient gripping force such that no additional restraints are required to hold the PGA in the fixture during submersion in an electrodeposition bath.

The method is well suited for multiple product fixturing and tight product spacing. Preferably round support elements provide a natural guiding lead for the pins, which makes loading the fixture easy, either automatically or manually. The method can be used with a variety of pin arrangements, but is preferably applied to interstitial pin arrays.

The method can also be used to straighten pins prior to plating. Similarly, the pins can be biased toward the gaps to be occupied during plating by using support elements to flex the pins in the opposite direction with a support member having a width that is sized to bend the pins beyond their elastic region of displacement.

Thus, the invention provides an effective and reliable method and apparatus for securely holding and grounding pin grid arrays during electrodeposition as well as related techniques for preparing the substrate assemblies for plating, thereby improving the quality of the plating procedure.

BRIEF DESCRIPTION OF THE DRAWINGS

There are shown in the drawings embodiments which are presently preferred, it being understood, however, that the invention is not limited to the precise arrangements and instrumentalities shown, wherein.

DETAILED DESCRIPTION OF PREFERRED EMBODIMENTS

The invention is directed to a method and apparatus for electrolytic plating, substrate assemblies of integrated circuits, also known as pin grid arrays or PGA's. The invention provides a system for securely holding a PGA for electrodeposition and other purposes and optionally grounding all circuits through the PGA pins without significantly obstructing the flow of a plating bath to the pins and the substrate.

Figure 1:
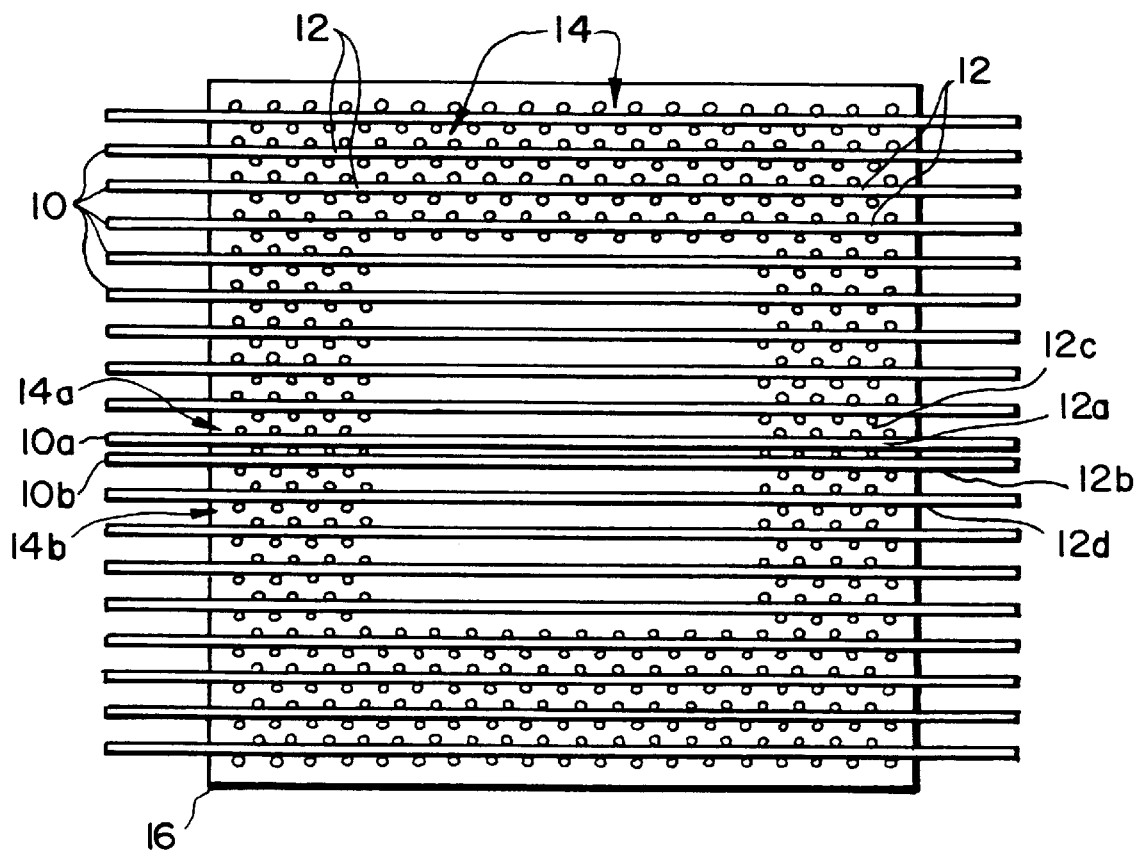
FIG. 1 is a top plan view of a pin grid array having an interstitial arrangement of pins with a plurality of exemplary support wires arranged according to the invention.

Referring to the figures and particularly to FIG. 1, the inventive fixture generally presents and supports a series of parallel, conductive support elements, such as wires 10, for positioning in gaps 12 between pin rows 14 of a PGA 16. Only a representative few of the wires 10, gaps 12, and pin rows 14 have been referenced for clarity of illustration. The wires 10 are generally spaced to insert in every other gap 12 for purposes discussed more fully below, and in the case of an odd number of rows, as shown, wires 10a, 10b can be inserted in two adjacent gaps 12a, 12b, provided a gap 12c, 12d is left unrestricted on the opposite side of each pin row 14a, 14b, respectively.

Figure 2:
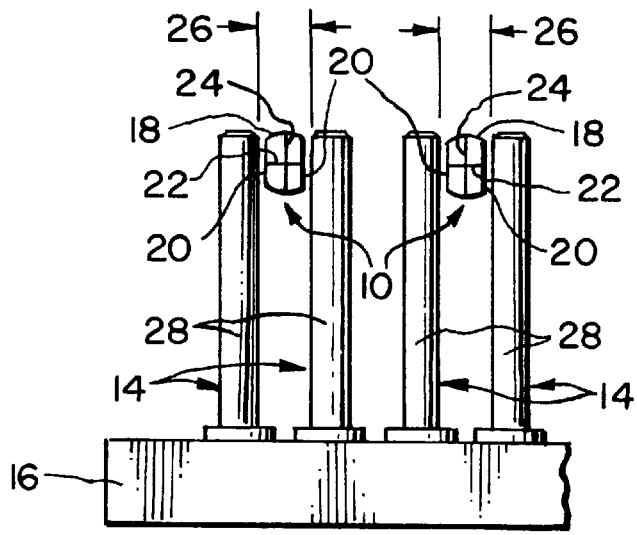
FIG. 2 is a side elevation of a pin grid array with a cross section of support wires in a releasing orientation.
Figure 3:
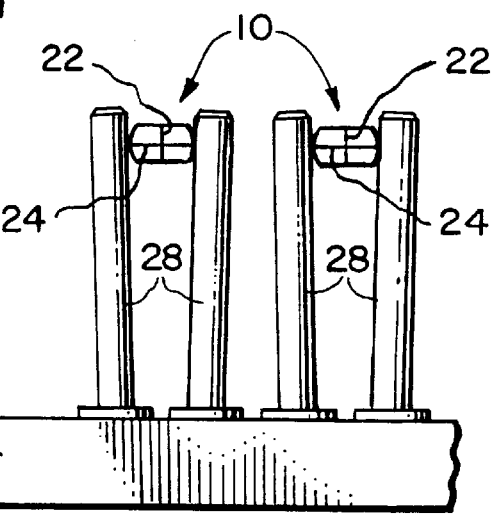
FIG. 3 is a side elevation of the pin grid array of FIG. 2 with a cross section of the support wires in a supporting orientation.

Referring to FIGS. 2 and 3, the cross sections 18 of the wires 10 are, for example, generally circular with flattened opposing sides 20 to provide a predetermined, first width 22 at the flattened location transitioning angularly to a second, larger width 24. The width 22 of the flattened section is less than or equal to the gap width 26 between the PGA pin rows 14. The larger, non-flattened diameter 24 is greater than the gap width 26 of the PGA pin rows 14. With this construction, the wires 18 can be oriented with the flattened sides 20 generally parallel to the pin rows 14 and freely inserted between the pin rows 14, as shown in FIG. 2. The wires 10 can then be rotated so that the wider, non-flattened section of the wire cross sections 18 engage the pin rows 14 and thereby spread and flex the adjacent pins 28, as shown in FIG. 3. The angle of rotation has been shown as approximately 90° for clear illustration; however, small rotations of 60° are possible and preferred.

The resilient reaction of the pins 28 provides a strong mechanical hold between the pins 28 and the wires 10 for supporting the PGA 16 during an electroplating process. The positive engagement between the spread pins 28 and the wires 10 can also provide a reliable electrical contact for shorting the PGA circuits for the plating procedure.

Alternative cross sectional geometries for the wires 10 can be used. The flattened circular arrangement discussed above is preferred when surface condition of the pins is critical because the curved transitions reduce or avoid scrapping and other surface damage to the PGA pins 28. Oval or elliptical cross sections could also achieve these objectives. In general, any cross section that presents a width larger than the gap width of the PGA pin rows to be secured at an angle to a width less than or equal to the PGA pin row gap width can be used.

Figure 3A:
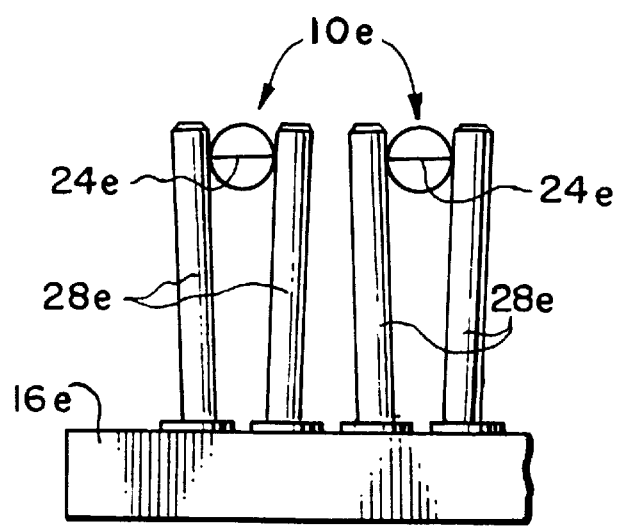
FIG. 3A is a side elevation of a pin grid array spread by alternative support wires with uniform cross sections.

As shown in FIG. 3A, when surface condition of the pins 28e is not critical, such as in preliminary zinc coating of pins 28e of a PGA 16e, wires 10e providing a width larger than the gap width of the PGA pin rows can be inserted in a wedge-like manner. These pins can have cross sections of uniform diameters 24e such as circles and therefore need not be rotated for engagement with the adjacent pins 28e.

Figure 4:
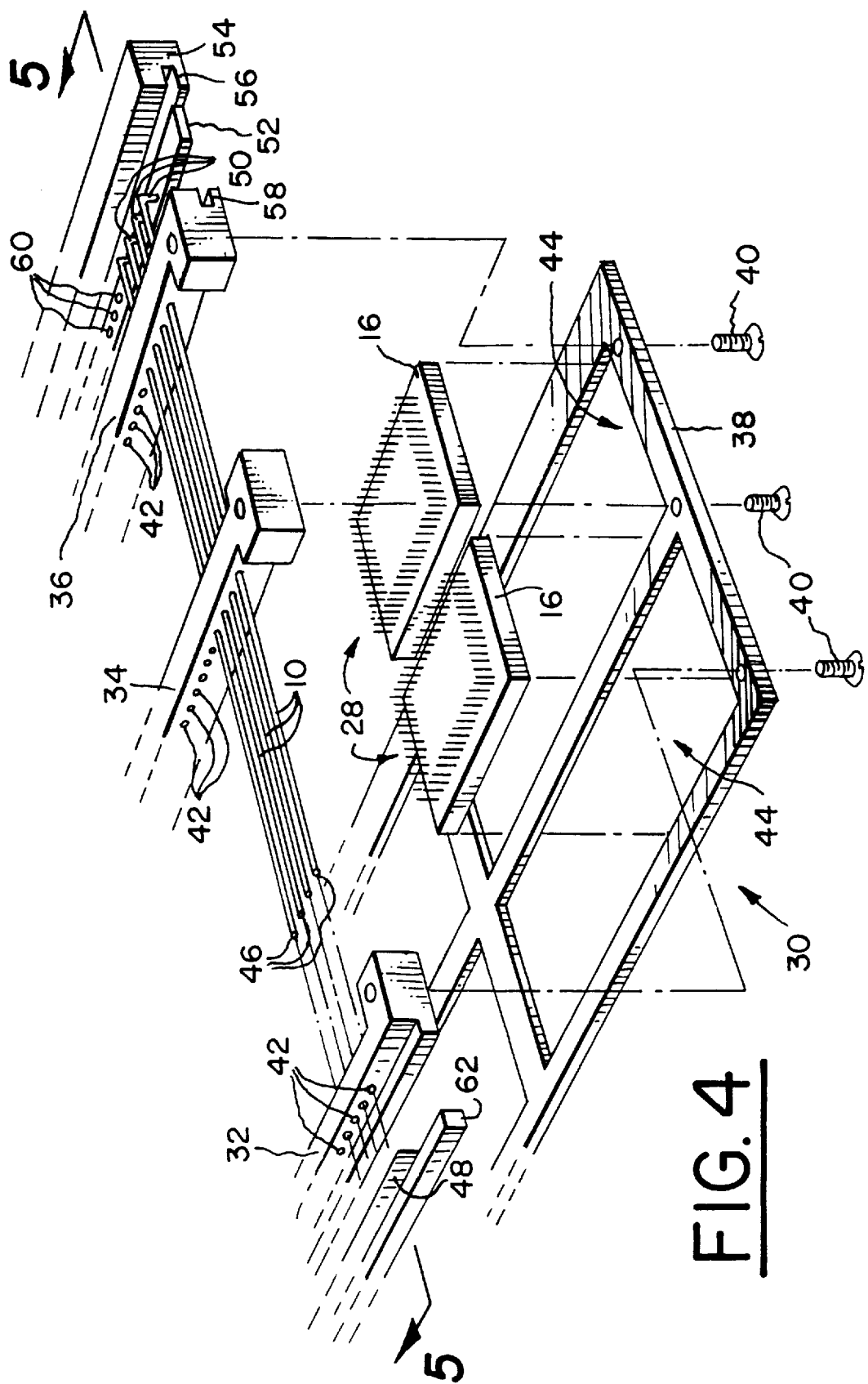
FIG. 4 is an exploded, perspective view of an exemplary electrolytic plating fixture according to the invention.
Figure 5:
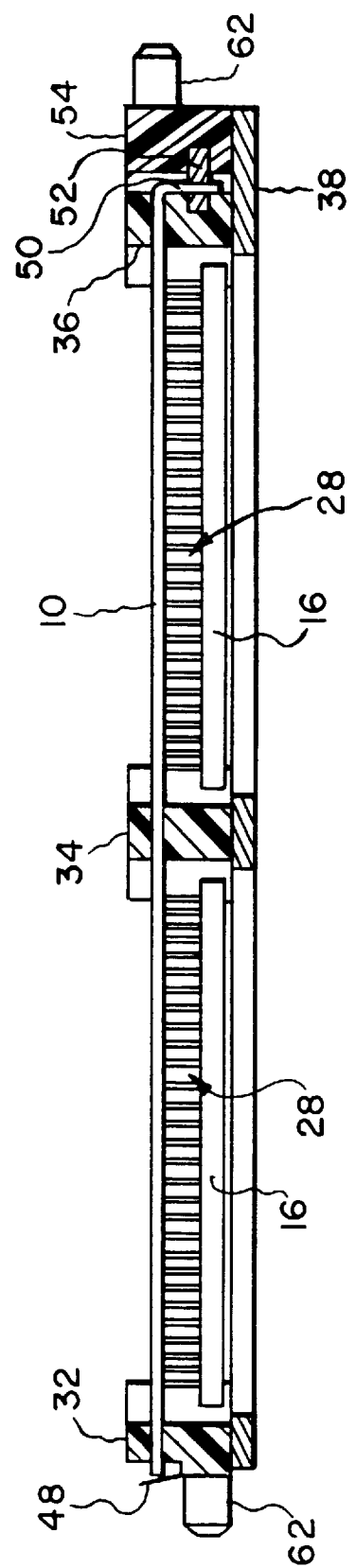
FIG. 5 is a cross section taken along line 5—5 in FIG. 4.

Referring to FIGS. 4 and 5, a plating fixture 30 preferably includes a series of support frame wire guides 32, 34, 36 spaced and arranged in parallel on a base plate 38 to which they are mounted by fasteners, such as flat head screws 40. The wire guides 32, 34, 36 support a series of the wires 10 that extend through aligned apertures 42 in the wire guides 32, 34, 36 and span across a plurality of openings 44 in the base plate 38, through which the pin grid arrays to be plated are inserted.

The base plate 38 can provide any number of openings 44, and each opening 44 preferably accommodates two PGA's. Only a few wires 10 are shown for clarity of illustration, but the fixture 30 preferably includes enough wires 10 to contact each pin 28 of each PGA 16. The pins 28 of each PGA 16 are positioned between the wires 10 and securely held and grounded in a manner as discussed above.

The inserted tip 46 of each wire 10 terminates on an outer side of the wire guide 32 for contact with a grounding surface, such as a thin metallic power strip 48 which is preloaded towards the wire guide 32 for resilient and conductive contact with the wire tip 46. The resilient force created by the contact between each wire tip 46 and the power strip 48 urges the associated wire 10 towards its opposing end 50 which is held in place by a lever 52 in a lever guide 54 mounted adjacent the wire guide 36.

The lever guide 54 provides an elongated channel 56 parallel to an opposing channel 58 in the wire guide 36 for sliding placement of the wire lever 52. The wire lever 52 provides a series of apertures 60, each aperture 60 receiving a bent end 50 of each wire 10.

The wire guides 32, 36 can be further strengthened by stiffener strips 62 mounted by fasteners such as machine screws or the like. The power strip 48 can be secured to the wire guide 32 by the stiffening strip 62.

Figure 6:
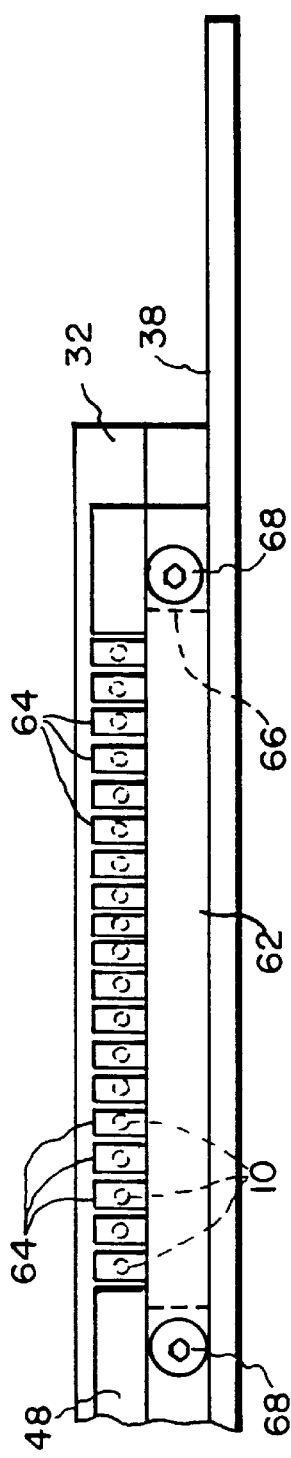
FIG. 6 is a left side elevation of the fixture shown in FIG. 4.

Referring to FIG. 6, the power strip 48 can provide separate contact leaves 64 for engaging each of the wires 10 individually. The contact leaves 64 are joined at their bases by a common strip 66 which can be sandwiched between the wire guide 32 and the stiffener strip 62 and secured machine screws 68.

Figure 7:
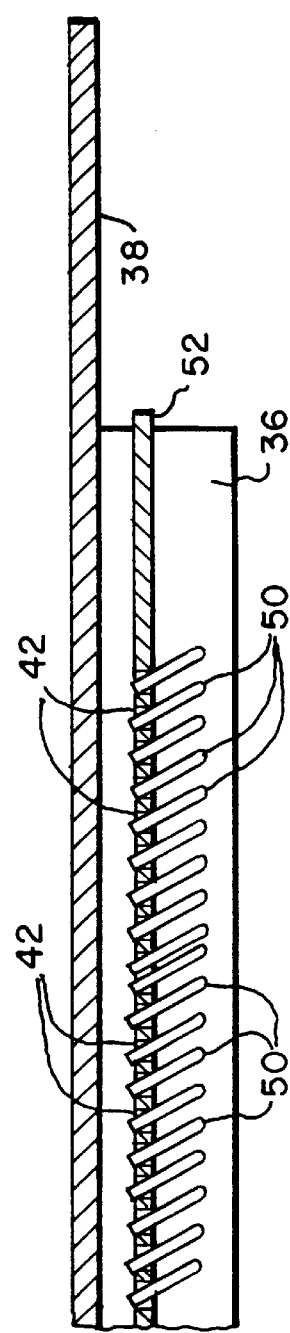
FIG. 7 is a right side elevation of the fixture shown in FIG. 4 with the wires in a releasing orientation.
Figure 8:
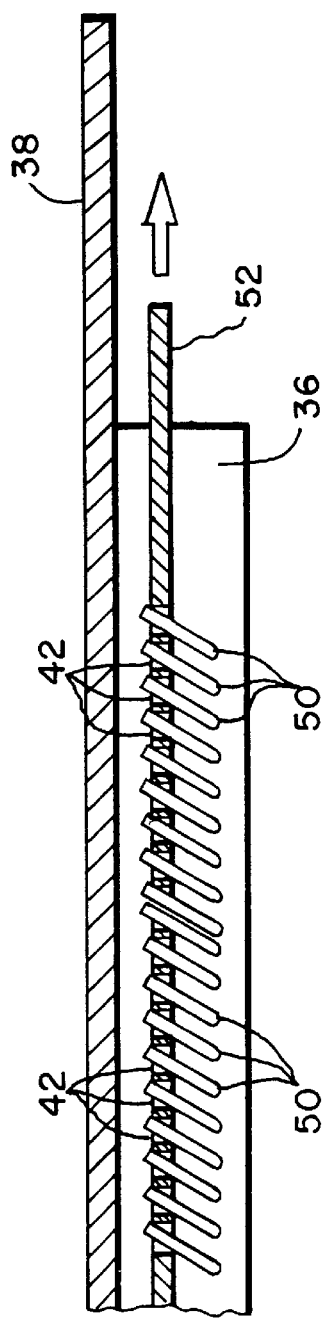
FIG. 8 is a right side elevation of the fixture shown in FIG. 4 with the wires in a holding orientation.

Referring to FIGS. 7 and 8, the wire lever 52 can be manipulated axially to rotationally manipulate the wires 10 via their bent ends 50. The cross sections of the wires can be arranged so that the flattened sections are aligned for sliding insertion into the PGA gaps (SEE FIG. 2.) when the bent ends 50 are positioned preferably at an angle of 30° by the wire lever 52, as shown in FIG. 7. The lever 52 can be slid to rotate the wires through a preferably 60° rotation via their bent ends 50 to urge the wider sections of the wire cross sections between the pin rows and thereby spread the pins into resiliently biased engagement with the wires (SEE FIG. 3). The apertures 42 in the wire lever 52 can be sized to permit the angular movement of the bent ends 50 during the wire lever motion.

The wire guides 32, 34, 36 are preferably made of polyethylene but can alternatively be made of any other suitable insulating material that is capable of supporting the wires. The lever guide 54 is similarly made of polyethylene or other insulating material. The stiffener strips 62 can be made of stainless steel or other metallic materials that are capable of providing stiffening assistance to the wire guides 32, 34, 36.

The wires 10 are preferably made of a conducting material, such as stainless steel. Stripes along which the wires 10 will engage the pins 28 in operation can be masked or otherwise not coated to provide a conductive surface for transferring electrical current with the pins during the plating process. The remaining portion of the wire 10 is preferably coated with an insulating material to avoid plating of the wires, thereby saving plating material costs. The uncoated conductive stripes can alternatively be replaced with conductive spots at the surfaces that the pins will engage.

Thus, the electrolytic plating fixture provides a reliable mechanism for uniformly plating pin grid arrays by ensuring complete grounding of the PGA circuits without significantly obstructing access of the plating bath to the PGA pins and substrate surfaces. Various alternatives within the scope of the invention may now be apparent to one having ordinary skill in the art.

For example, the fixture can have other applications in the electroplating process. Prior to electroplating, the fixture can also be used to straighten PGA pins by placing wires having widths calculated to bend the pins so that the subsequently unstressed, resting position is substantially perpendicular to the substrate.

The fixture can also be used to position PGA pins to bend toward the gaps in which the conductive wires are inserted during the plating process. This positioning can further enhance the integrity of the engagement between the wires and the pins during plating. In the pre-bending process, wires having cross sections with predetermined diameters are placed in the gaps that are not to be occupied during the plating process and are to urge the pins toward the gaps to be used during plating. The diameters are preferably selected to bend the wires past their elastic ranges so that the pins remain in the bent position after the wires are removed.

Although the invention has been particularly described for preferred construction and applications, it can be provided in other specific embodiments without departing from the spirit or essential attributes thereof, and accordingly, reference should be had to the following claims, rather than the foregoing specification, as indicating the scope of the invention.

I claim:

1. An electrolytic plating system for pin grid arrays, the pin grid arrays having adjacent rows of pins, the adjacent rows of pins each separated by a gap having a gap width, said system comprising:
   a fixture for releasably securing a pin grid array, said fixture including:
   a support frame; and
   a plurality of wires supported by said support frame and extending substantially in parallel, each of said wires having a cross section having a width larger than the gap widths separating the adjacent rows of pins of said said pin grid array to be secured by the fixture, said wires being spaced on said support frame to align with the gaps separating the adjacent rows of pins of said pin grid array;
   said fixture adapted for submersion in an electrodeposition plating bath.

2. The system according to claim 1, wherein said wires are spaced on said support frame to align with gaps of a pin grid array to be supported by the fixture such that each gap occupied by a wire is opposed, on an opposite side of an adjacent pin row, by an unoccupied gap to permit bending of the pin row by the wire.

3. The system according to claim 1, wherein the support frame includes a grounding surface, each of said wires being electrically conductive and contacting the grounding surface of the support frame.

4. The system according to claim 3, wherein the grounding surface is provided by a conductive strip mounted to the support frame and extending transverse to the parallel wires for conductive contact with each wire.

5. The system according to claim 3, wherein the grounding surface is connectable to a cathode external to the fixture.

6. The system according to claim 1, wherein the support frame includes a plurality of wire guides, each having individual apertures for receiving each of the wires, said support frame further including a base to which each of the wire guides is mounted, said base having an opening for passage of a pin grid array to and from the wires.

7. An electrolytic plating system for pin grid arrays, the pin grid arrays having adjacent rows of pins, the adjacent rows of pins each separated by a gap having a gap width comprising:
   a fixture for releasably securing a pin grid array, said fixture including:
   a support frame;
   a plurality of wires supported by said support frame and extending substantially in parallel, each of said wires having a cross-section having a first width transitioning to a second, larger width at an angle to the first width; and
   a rotator for rotating the wires to shift the orientation of the cross section of each wire relative to pins of a pin grid array held by the fixture;
   said fixture adapted for submersion in an electrodeposition plating bath.

8. The system according to claim 7, wherein the support frame includes a grounding surface, each of said wires being electrically conductive and contacting the grounding surface of the support frame.

9. The system according to claim 8, wherein the grounding surface is provided by a conductive strip mounted to the support frame and extending transverse to the parallel wires for conductive contact with each wire.

10. The system according to claim 8, wherein the grounding surface is connectable to a cathode external to the fixture.

11. The system according to claim 7, wherein the first width is sized less than or equal to said gap width and the second width is sized greater than said gap width, such that a wire can be inserted in said gap when the first width traverses said gap and the wire can be rotated so that the second, larger width traverses the gap and thereby spreads adjacent pins into a resilient engagement.

12. The system according to claim 7, wherein the support frame includes a plurality of wire guides, each having individual apertures for receiving each of the wires, said support frame further including a base to which each of the wire guides is mounted, said base having an opening for passage of a pin grid array to and from the wires.

13. The system according to claim 7, wherein said wires are spaced on said support frame to align with gaps of a pin grid array to be supported by the fixture such that each gap occupied by a wire is opposed, on an opposite side of an adjacent pin row, by an unoccupied gap to permit bending of the pin row by the wire.

14. An electrolytic plating system for pin grid arrays, the pin grid arrays having adjacent rows of pins, the adjacent rows of pins each separated by a gap having a gap width comprising:

a fixture for releasably securing a pin grid array, said fixture including:
a support frame;
a plurality of support members supported by said support frame and extending substantially in parallel, each of said support members having a cross-section having a first width transitioning to a second, larger width at an angle to the first width, wherein the cross section is generally circular with opposing flattened surfaces defining the first width; and
a rotator for rotating the support members to shift the orientation of the cross section of each support members relative to pins of a pin grid array held by the fixture;
said fixture adapted for submersion in an electrodeposition plating bath.

15. An electrolytic plating system for pin grid arrays, the pin grid arrays having adjacent rows of pins, the adjacent rows of pins each separated by a gap having a gap width comprising:

a fixture for releasably securing a pin grid array, said fixture including:
a support frame;
a plurality of support members supported by said support frame and extending substantially in parallel, each of said support members having a cross-section having a first width transitioning to a second, larger width at an angle to the first width, wherein the cross section is elliptical; and
a rotator for rotating the support members to shift the orientation of the cross section of each support members relative to pins of a pin grid array held by the fixture;
said fixture adapted for submersion in an electrodeposition plating bath.

16. An electrolytic plating system for pin grid arrays, the pin grid arrays having adjacent rows of pins, the adjacent rows of pins each separated by a gap having a gap width comprising:

a fixture for releasably securing a pin grid array, said fixture including:
a support frame;
a plurality of support members supported by said support frame and extending substantially in parallel, each of said support members having a cross-section having a first width transitioning to a second, larger width at an angle to the first width; and
a rotator for rotating the support members to shift the orientation of the cross section of each support members relative to pins of a pin grid array held by the fixture, said rotator including a lever for engaging the end of each support member and rotating each support member by axial translation of the lever;
said fixture adapted for submersion in an electrodeposition plating bath.

17. A fixture for releasably securing and electrically grounding a pin grid array for electrolytic plating, the pin grid array having adjacent rows of pins each separated by a gap having a gap width, said fixture comprising:

a plurality of wires extending substantially in parallel, each of said wires being electrically conductive, each of said wires having a cross section having a first width transitioning to a second, larger width at an angle to the first width, wherein the first width is sized less than or equal to said gap width and the second width is sized greater than said gap width, wherein the cross section is generally circular with opposing flattened surfaces defining the first width, wherein a wire can be inserted in the gap when the wire is oriented such that the first width traverses the gap, and the wire can be rotated to orient the wire such that the second, larger width traverses the gap, thereby spreading adjacent pins into a resilient engagement.

18. A method of releasably securing and electrically grounding a pin grid array during electrolytic plating, the pin grid array having adjacent rows of pins each separated by a gap having a gap width, the method comprising the steps of:

providing a plurality of electrically conductive support elements in substantially parallel juxtaposition on a supporting frame, each of said support elements having a cross section having a first width transitioning to a second, larger width at an angle to the first width, wherein the first width is sized less than or equal to said gap width and the second width is sized greater than said gap width;

orienting the first width of each support member substantially parallel to a gap between adjacent rows of pins in the pin grid array;

inserting each of the support elements in a gap between rows of pins in the pin grid array, leaving at least one empty gap opposite each support element; and rotating each of the support elements to orient the second, larger width to traverse the gap, said rotation effecting contact between said support elements and said pins such that said pins are electrically grounded and said pin grid array is releasably secured in said fixture.

19. A method of bending pins in a pin grid array having rows of pins extending from a flat substrate, each of the rows separated from an adjacent row of pins by a gap having a gap width, said method comprising the steps of:

providing a plurality of support elements in substantially parallel juxtaposition on a supporting frame, each of said support elements having a cross section having a first width transitioning to a larger, second width;

inserting each of the support elements in one of the gaps formed between said adjacent rows, leaving at least one empty gap opposite each support element; and rotating each of the support elements to orient the second cross-sectional width to traverse the gap, said rotation effecting bending of said pins.

20. The method according to claim 19, wherein the pins are substantially perpendicular to the underlying substrate when said first cross-sectional width traverses the gap.

21. The method according to claim 19, wherein each row of pins is bent toward an empty gap when said second cross-sectional width traverses the gap.

22. A fixture for securing a pin grid array, said fixture comprising:

a support frame having a grounding surface;

a plurality of electrically conductive support elements supported by said support frame and extending substantially in parallel, each of said support elements contacting the grounding surface of said support frame, and each of said support elements having a cross section having a first width transitioning to a second, larger width at an angle to the first width; and a rotator for rotating the support elements to shift the orientation of the cross section of each support element.

* * * * *